(12) United States Patent
Yang et al.

(10) Patent No.: US 6,389,323 B1
(45) Date of Patent: May 14, 2002

(54) METHOD AND SYSTEM FOR YIELD LOSS ANALYSIS BY YIELD MANAGEMENT SYSTEM

(75) Inventors: Jiunn-Der Yang, Kaoshing; Renn-Shyan Yeh, Taichun; Chao-Hsin Chang; Wen-Chen Chang, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/426,405

(22) Filed: Oct. 25, 1999

Related U.S. Application Data

(62) Division of application No. 09/067,264, filed on Apr. 27, 1998, now Pat. No. 6,017,771.

(51) Int. Cl.$^7$ .............................................. G06F 19/00
(52) U.S. Cl. ...................... 700/110; 700/109; 700/121; 324/765
(58) Field of Search ..................... 700/108–110, 121; 438/7, 10–12, 14, 16–18; 324/765; 382/145; 714/724

(56) References Cited

U.S. PATENT DOCUMENTS

| | | | |
|---|---|---|---|
| 4,801,869 A | 1/1989 | Sprogis .................... 324/73 |
| 5,475,695 A | 12/1995 | Caywood et al. .............. 371/27 |
| 5,544,256 A | 8/1996 | Brecher et al. .............. 382/149 |
| 5,598,341 A | 1/1997 | Ling et al. .............. 364/468.17 |
| 5,665,609 A | * 9/1997 | Kiyoshi ........................ 438/16 |
| 5,971,586 A | * 10/1999 | Kiyoshi ...................... 700/108 |
| 6,016,562 A | * 1/2000 | Miyazaki et al. ........... 714/724 |

* cited by examiner

Primary Examiner—Leo P. Picard
Assistant Examiner—Steven R. Garland
(74) Attorney, Agent, or Firm—George O. Saile; Stephen B. Ackerman; Graham S. Jones, II

(57) ABSTRACT

A method and system provide for yield loss analysis for use in determining the killer stage in the manufacture of a semiconductor wafer at a plurality of manufacturing stages. The method comprising the following steps. Inspect semiconductor devices on the wafer visually to identify the location of visual defects on dies being manufactured on the wafer and to maintain a count of visual defects on the dies by location. Inspect the semiconductor dies on the wafer to determine the location and number defective dies on the wafer at each of the manufacturing stages. Calculate the defective die count for each stage for the wafer. Calculate the defective bad die count for each stage for the wafer. Determine the percentage of the defective bad die count divided by the defective die count. Plot the trend of the percentage of yield loss and the percentage of defective bad dies for each of the manufacturing stages. Compare the plots to determine the killer stage from analysis of the relative trends of matching between the plots of yield lost and the percentage of bad dies for the stage.

6 Claims, 8 Drawing Sheets

| Area 1:<br><br>CLEAN GOOD DIE<br>(CGD) | Area 3:<br><br>DEFECTIVE GOOD DIE<br>(DGD) |
|---|---|
| Area 2:<br><br>CLEAN BAD DIE<br>(CBD) | Area 4:<br><br>DEFECTIVE BAD DIE<br>(DBD) |

METHOD AND SYSTEM FOR YIELD LOSS ANALYSIS BY YIELD MANAGEMENT SYSTEM

This is a division of patent application Ser. No. 09/067,264, now U.S. Pat. No. 6,017,771, filing date Apr. 27, 1998, Method And System For Yield Loss Analysis By Yield Management System, assigned to the same assignee as the present invention.

BACKGROUND OF THE INVENTION

1. Field of the Invention

This invention relates to methods and apparatus for systems for manufacture of semiconductor devices and more particularly to yield loss analysis in yield management systems.

2. Description of Related Art

U.S. Pat. No. 5,598,341 of Ling et al. for "Real-Time In-Line Defect Disposition and Yield Forecasting System" shows a real time defect disposition and yield forecasting system which uses KLA and INSPEC inspection tools. A particle in contact with two conductor lines is described as a "killer defect." It is stated that the particle "may kill or prevent the normal operation of the semiconductor device which utilizes conductors . . . " Ling describes a real time, in-line system. An inspection method/tool provide for inspection of at least two layers of a semiconductor wafer, producing "first information" on particle size, particle location, and the number of particles. A design review station inspects those at least two layers and produces "second information" including the layouts of each of those at least two layers. A yield management station is operatively connected to the in-line fabrication inspection tool and to the design review station. The yield management station determines at least one of a number of killer defects for the devices in each of the at least two layers or a defect sensitive area index for each of the at least two layers responsive to layers using the first and second information. Determination of a priority is made for analyzing each of the at least two layers responsive to at least one of the number of killer defects and the defect sensitive area index for each of the at least two layers. See col. 5, line 55 to col. 7, line 8. Ling does not appear to disclose the 6th order polynomial curve fit to identify the killer stage, but Ling does describe a general analysis method/tool/program, Col. 6, line 55 to Col. 7, line 8.

U.S. Pat. No. 5,475,695 of Caywood et al. for "Automatic Failure System" teaches an automatic failure analysis system which discloses automatic fault extraction (AFE) and a specific analysis technique called inductive fault analysis (IFA).

U.S. Pat. No. 4,801,869 of Sprogis for "Semiconductor Defect Monitor for Diagnosing Processing-Induced Defects" shows a design for a defect monitor pattern/wafer.

U.S. Pat. No. 5,544,256 of Brecher for "Automated Defect Classification System" shows an automated defect classification system for analyzing digital images of defects.

KLA In-line defect inspection tools and the Yield Management System (YMS) are popular tools for studying the visual defect in process but heretofore, there has been no systematic method for determining the correlation between yield loss and visual defects. In the more complicated manufacturing processes, the state of the art methods of yield loss analysis have made it difficult to correlate the major killing stages to the resulting losses in yield. Thus it has been difficult to be efficient in selecting which action to take to improve the yield.

SUMMARY OF THE INVENTION

An object of this invention is to identify the correlation between yield loss and visual defects and to find out the major yield killing stages.

The invention includes a yield management method which performs the features as follows:

$C_p$ Yield Test;

The definition of four kinds of dies from the $C_p$ yield test;

The defective bad die compared with yield loss;

The definition of defective bad die percentage (DBD%) and defective bad die count (DBDC);

A trend chart comparison between DBD% and yield loss;

A trend chart comparison between DBDC and yield loss;

Finding the major killer stages.

The invention is a yield management system which performs the functions as follows:

1) correlates the visual defects on dies on a wafer to loss of die yield,
2) accumulates data for run analysis to produce plots of data for each wafer on a stage by stage basis, which can be used to find the killer stage, and
3) uses a polynomial curve fitting (6th order) method to produce curves which are compared to determine which of the stages of the production line is the killer stage.

The present invention focuses upon a single stage of manufacture of a single layer at a time, unlike Ling et al.

Analysis is made of the percentage of defective bad dies (DBD %) compared with yield loss in as expressed in a trend chart.

In addition, analysis is made of the Defective Bad Die Count (DBDC) compared with the yield loss as expressed in a trend chart.

Further factors to consider are as follows:

1. DBD %: that can involve at least two different types of products but they use the same design rule (i.e. 0.5 $\mu$m design rule.)
2. DBDC: just for the single product analysis.

The system is used to analyze the overall yield trend. This system forecasts the applicability of the process employed to different products from the one being focused upon. (DBD %)

Caywood et al. discloses a specific analysis technique which is different from the sixth (6th) degree polynomial regression of the invention.

In accordance with this invention, a method for yield loss analysis for use in determining the killer stage in the manufacture of a semiconductor wafer at a plurality of manufacturing stages comprises the following steps.

Inspect semiconductor devices on the wafer visually to identify the location of visual defects on dies being manufactured on the wafer and to maintain a count of visual defects on the dies by location.

Inspect the semiconductor dies on the wafer to determine the location and number defective dies on the wafer at each of the manufacturing stages.

Calculate the defective die count for each stage for the wafer.

Calculate the defective bad die count for each stage for the wafer.

Determine the percentage of the defective bad die count divided by the defective die count.

Plot the trend of the percentage of yield loss and the percentage of defective bad dies for each of the manufacturing stages. and Compare the plots to determine the killer stage from analysis of the relative trends of matching between the plots of yield lost and the percentage of bad dies for the stage.

Preferably the method includes the additional steps, as follows:

Plot the trend of the percentage of yield loss and the percentage of defective bad dies for each of the manufacturing stages with sixth order fitting curves.

Compare the plots with the sixth order fitting curves to determine the killer stage from analysis of the relative trends of matching between the plots of yield lost and the percentage of bad dies for the stage.

Calculate the defective bad die count for several combined stages.

Plot a trend chart for the combined plot.

Preferably plot that trend chart for stages with fitting curves which indicate possibly matching trends.

In accordance with another aspect of this invention, a system for yield loss analysis for use in determining the killer stage in the manufacture of a semiconductor wafer at a plurality of manufacturing stages is provided.

The system comprises as follows:

Means for inspecting semiconductor devices on the wafer visually to identify the location of visual defects on dies being manufactured on the wafer and to maintain a count of visual defects on the dies by location;

Means for inspecting the semiconductor dies on the wafer to determine the location and number defective dies on the wafer at each of the manufacturing stages;

Means for calculating the defective die count for each stage for the wafer;

Means for calculating the defective bad die count for each stage for the wafer;

Means for determining the percentage of the defective bad die count divided by the defective die count;

Means for plotting the trend of the percentage of yield loss and the percentage of defective bad dies for each of the manufacturing stages; and Means for comparing the plots to determine the killer stage from analysis of the relative trends of matching between the plots of yield lost and the percentage of bad dies for the stage.

Preferably the system includes:

Means for plotting the trend of the percentage of yield loss and the percentage of defective bad dies for each of the manufacturing stages with sixth order fitting curves;

Means for comparing the plots with the sixth order fitting curves to determine the killer stage from analysis of the relative trends of matching between the plots of yield lost and the percentage of bad dies for the stage;

Means for calculating the defective bad die count for several combined stages;

Means for plotting the trend of the percentage of yield loss and the percentage of defective bad dies for each of the manufacturing stages with sixth order fitting curves;

Means for plotting a trend chart for the combined plot;

Means for plotting a trend chart for stages with fitting curves which indicate possibly matching trends.

BRIEF DESCRIPTION OF THE DRAWINGS

The foregoing and other aspects and advantages of this invention are explained and described below with reference to the accompanying drawings, in which:

In FIG. 12 the key BDC stands for Bad Die Count, and the key DBDC stands for Defective Bad Die Count including the upper curve of six stages DBDC the and the lower curve of yield lost BDC as a function of the wafer number of wafers being inspected. FIG. 13 shows the accumulation of the DBDC of three stages Poly1-Etch; VIA1-Oxide1-Dep; and Plug3-W-Etch Back.

DESCRIPTION OF THE PREFERRED EMBODIMENT

The purpose of the method of this invention is to point out the correlation between visual defects and lost yield. The method will be described below in connection with the flow chart in FIG. 1.

Figure 1:
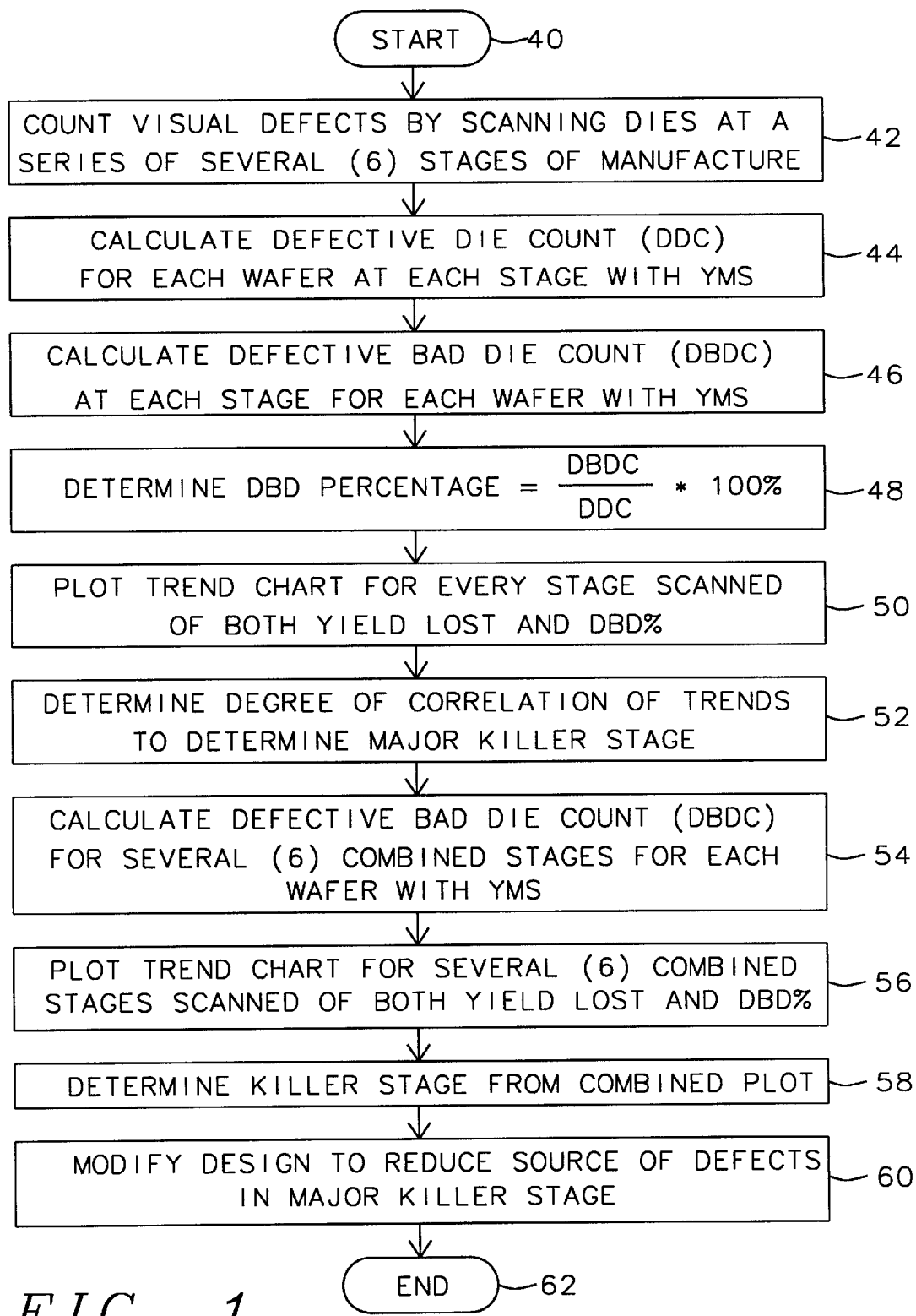
FIG. 1 is a flow chart of the method of this invention and the operation of the system of this invention.
Figure 2:
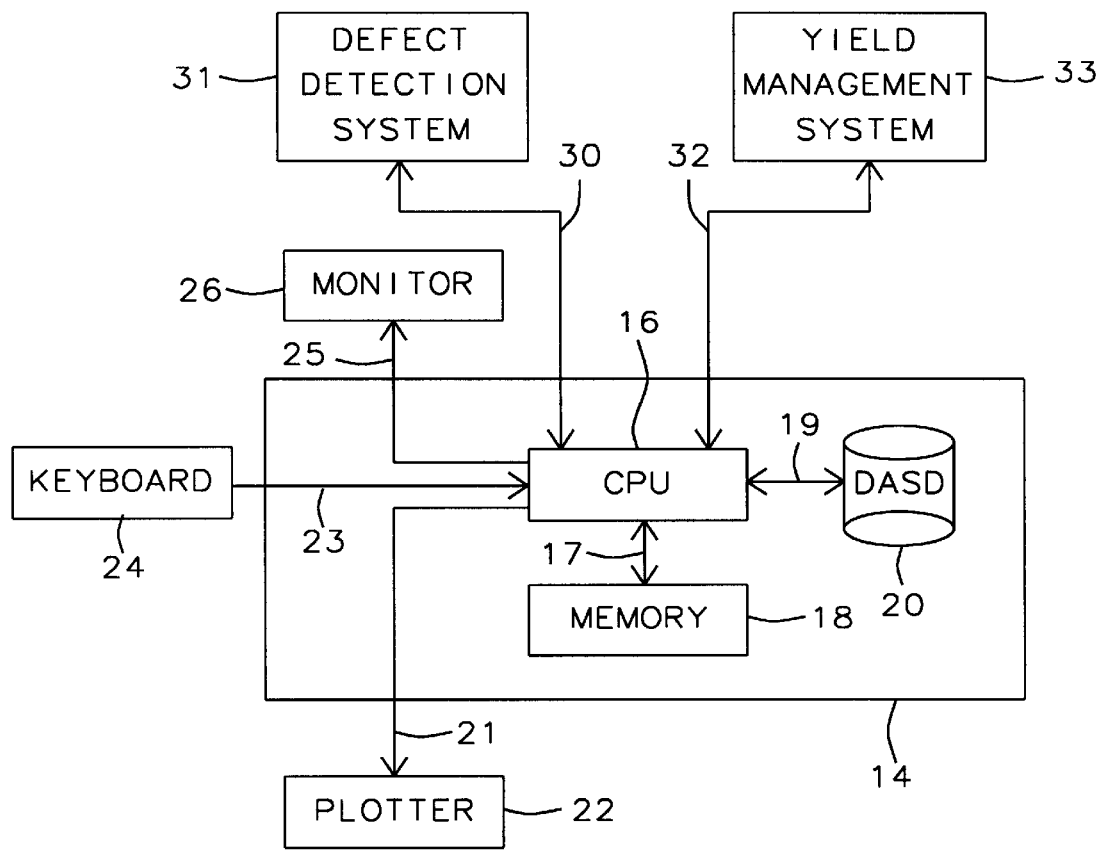
FIG. 2 shows a system for performing the method of FIG. 1 in a manufacturing system.
Figure 3:
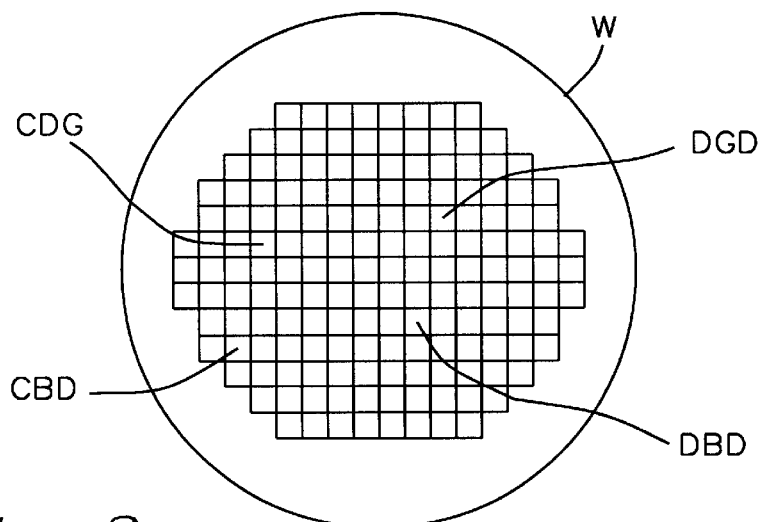
FIG. 3 shows a semiconductor wafer on which is a plurality of dies have been produced in accordance with the operation of the system and method of this invention.

FIG. 2 shows a system for performing the method of FIG. 1 in a manufacturing system which is producing a plurality of dies on a semiconductor wafer W of the kind shown in FIG. 3. Wafer W includes some dies which are perfect and some dies which have imperfections. There are four different types of dies including a Clean Good Die (CGD), Clean Bad Die (CBD), Defective Good Die (DGD), Defective Bad Die (DBD). A "Clean" die is a die without a visual defect. A "Defective" die is a die with a visual defect. A "Good" die is a die which will perform satisfactorily. A "Bad" die is a die which will not perform satisfactorily.

Figures 4, 5:
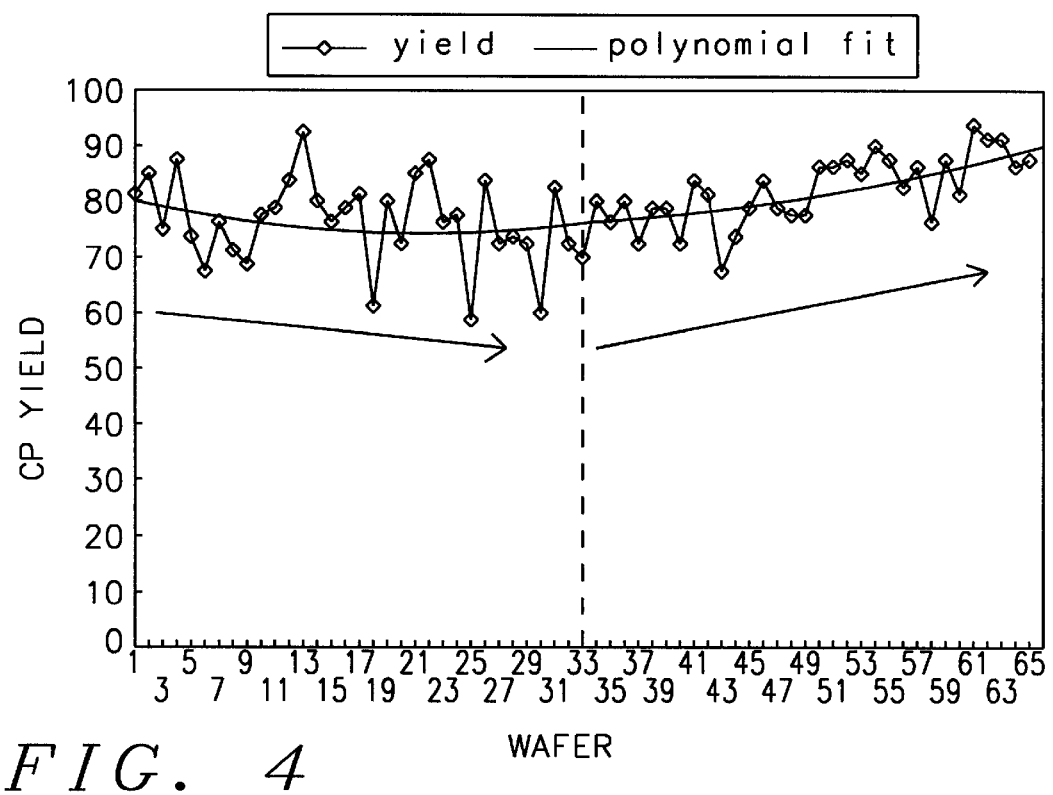
FIG. 4 shows a chart of the result of a $C_p$ yield test using the novel method of this invention for yield improvement analysis.
FIG. 5. shows a chart of four sets of die categories with respect to good and defective dies which are either clean or defective.

FIG. 4 shows a chart of the result of a $C_p$ yield test using the novel method of this invention for yield improvement analysis by the results of KLA defect scan by a Yield Improvement Analysis by KLA-Tencor In-Line Monitor System.

$C_p$ is defined as follows:

$$C_p = \frac{\text{Good die count}}{\text{Gross die count}} \times 100\%$$

The data is plotted with the $C_p$ Yield data vs. the Wafer Number from Wafer 1 to Wafer 65.

As can be seen from wafer number 1 through wafer number 33, the $C_p$ Yield Trend was Down.

→Slow Downward Trending

After some adjustments have been performed in accordance with this invention at the killer stages as pointed out by this invention, there is an improvement from wafer number 34 through wafer number 65, where the $C_p$ Yield Trend is Up.

FIG. 5. shows a chart of four sets of die categories with respect to good and defective dies which are either clean or defective. Area 1 plus Area 3 of the chart encompass the total number of dies. Within the Areas 1 plus 3 area areas 2 and 3 which cover only the bad dies which can be either clean or defective. The areas shown in FIG. 5 are as follows:

Area 1: Clean Good Die (CGD)
Area 2: Clean Bad Die (CBD)
Area 3: Defective Good Die (DGD)
Area 4: Defective Bad Die (DBD)

The four areas 1–4 are described in terms of the visual details and the yield test in Table I below.

TABLE I

| Areas Evaluated | As to visual detail | As to yield test | Type of Die |
|---|---|---|---|
| Area 1 | Clean | Good Die | CGD |
| Area 2 | Clean | Bad Die | CBD |
| Area 3 | Defective | Good Die | DGD |
| Area 4 | Defective | Bad Die | DBD |

Yield Loss=CBD+DBD=(Area 2+Area 4)

The novel method of yield improvement of this invention is focused on the DBD area (Area 4) vs. the Yield Loss areas (Area 2+Area 4). That is to say, that the present invention focuses upon improvement of yield by focusing upon the Area 4 as distinguished from the combination of Area 2 plus Area 4.

Parameters which are used in analyzing the products of the manufacturing process, in accordance with this invention are as follows:

$$DBD\% = \frac{DBDC}{DDC} * 100\%$$

(for different products, but the same design rule)

where
DDC=Defective Die Count (Scanned by KLA)
DBDC=Defective Bad Die Count

To calculate the DBD % for every stage and to compare the trend chart with $C_p$ yield, that could show the correlations between the $C_p$ yield loss and the specific defects. Definition of Defective Bad Die Count (DBDC) Same processes (design rule), same product type (same product.)

To accumulate the defective bad die count for the specific stages which there are obviously correlations with $C_p$ yield loss and to compare the trend chart between them, that show the major killer Stages for $C_p$ yield loss.

Referring to FIG. 2 again, the system used to perform this invention includes a computer system 14 with a Central Processing Unit (CPU) 16. CPU 16 is connected by line 17 to memory 18. CPU 16 is also connected by line 19 to Direct Access Storage Device (DASD) 20. A keyboard 24 is connected by line 23 to CPU 16 to supply input data and commands from the operator to CPU 16. A line 25 connects from CPU 16 to monitor 26 which is viewed by the operator.

Figure 10:
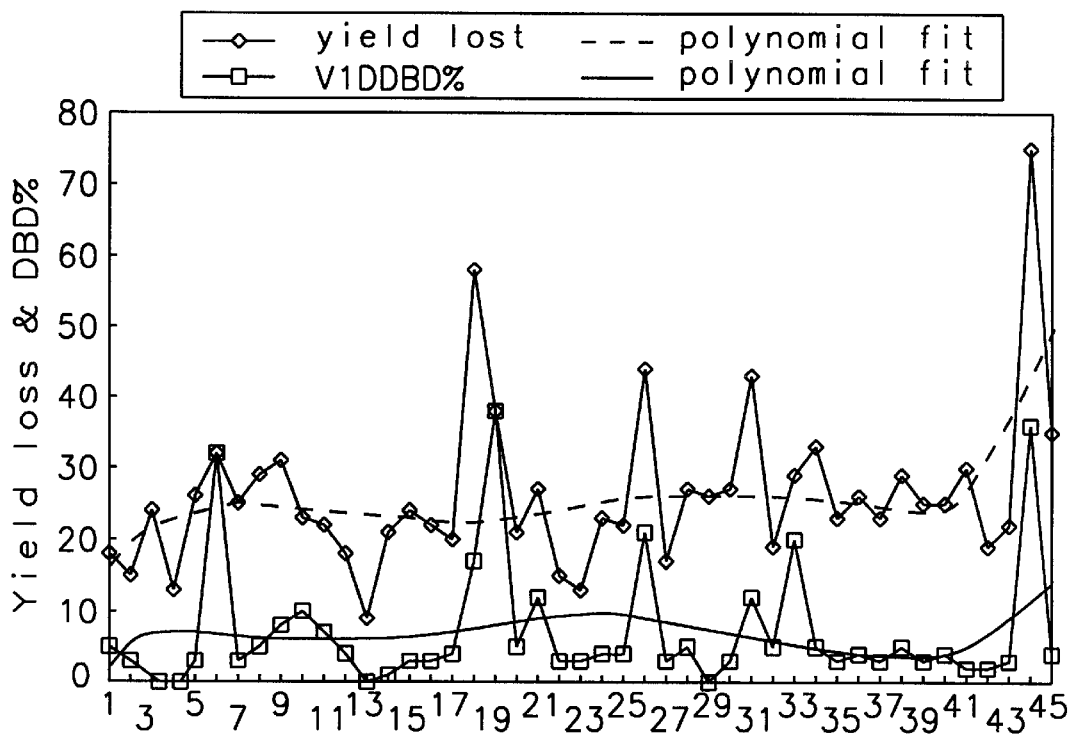
FIG. 10 shows the trend chart of yield loss & DBD % for the VIA1-Oxide1-DEP stage.
Figure 11:
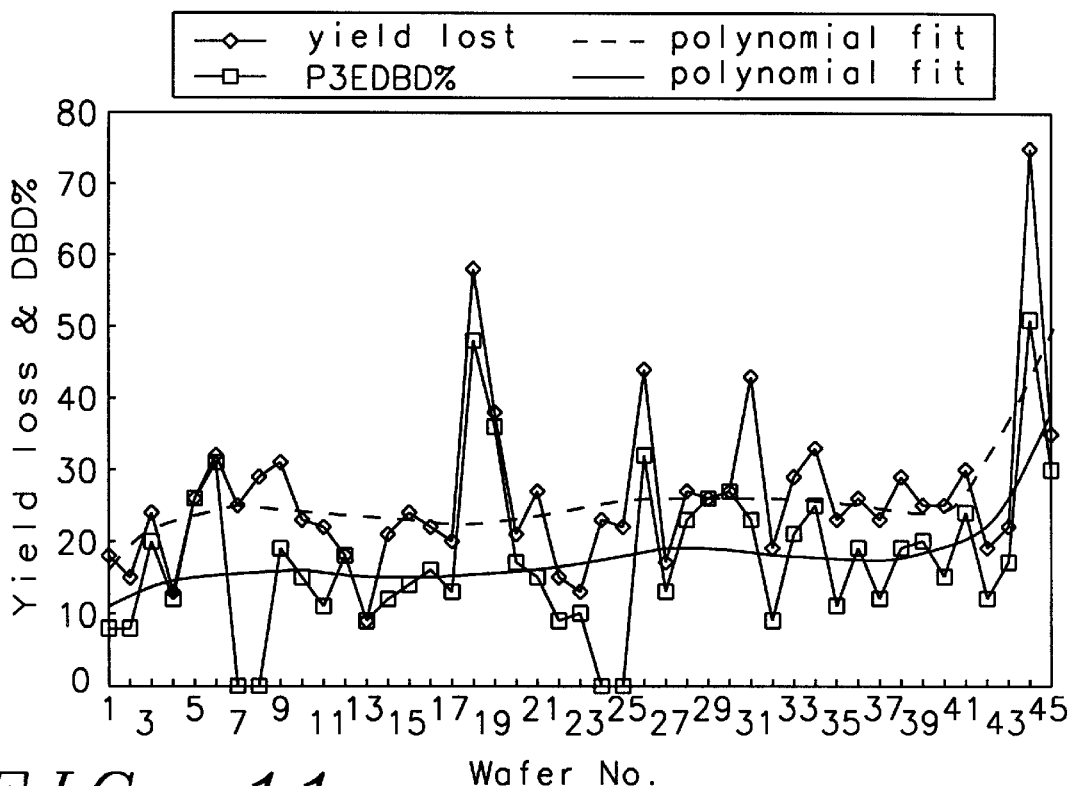
FIG. 11 shows the trend chart of yield loss & DBD % for the Plug3-W-Etch Back stage.
Figure 12:
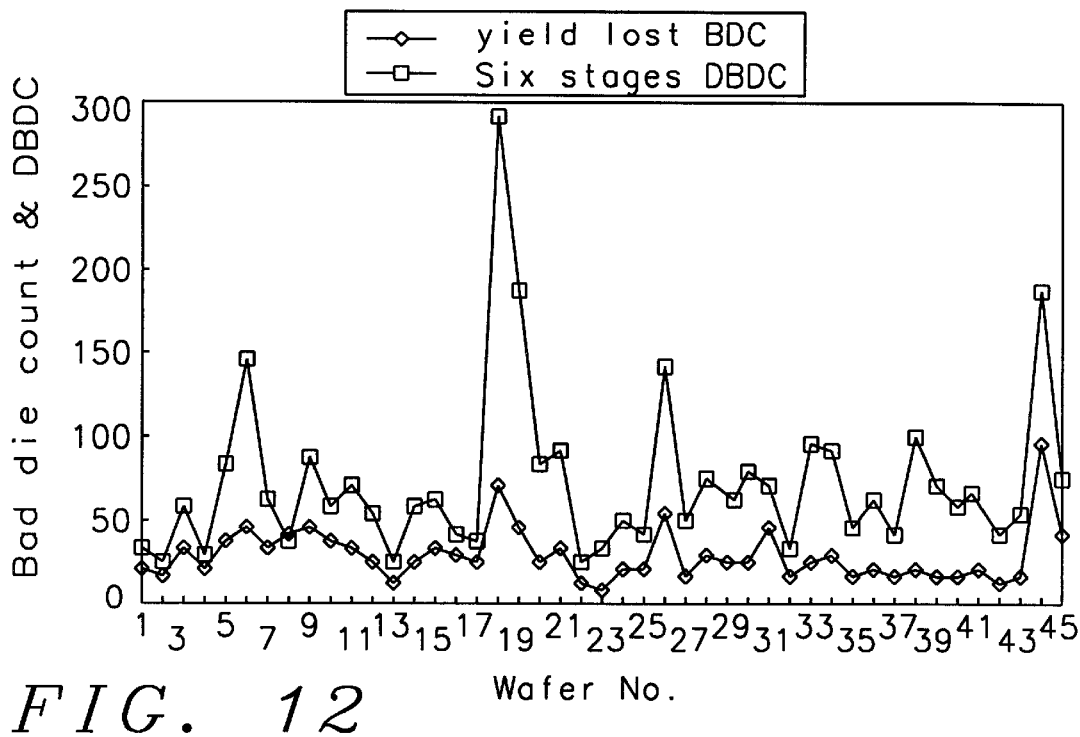
FIGS. 12 and 13 show the correlation of 0.5 $\mu$m SPTM logic $C_p$ yield lost and KLA In-line Monitor results for the six stages of FIGS. 6–11 combined. The sampling is for 2 wafers in 1 lot. The defect size is greater than 2 $\mu$m.
Figure 13:
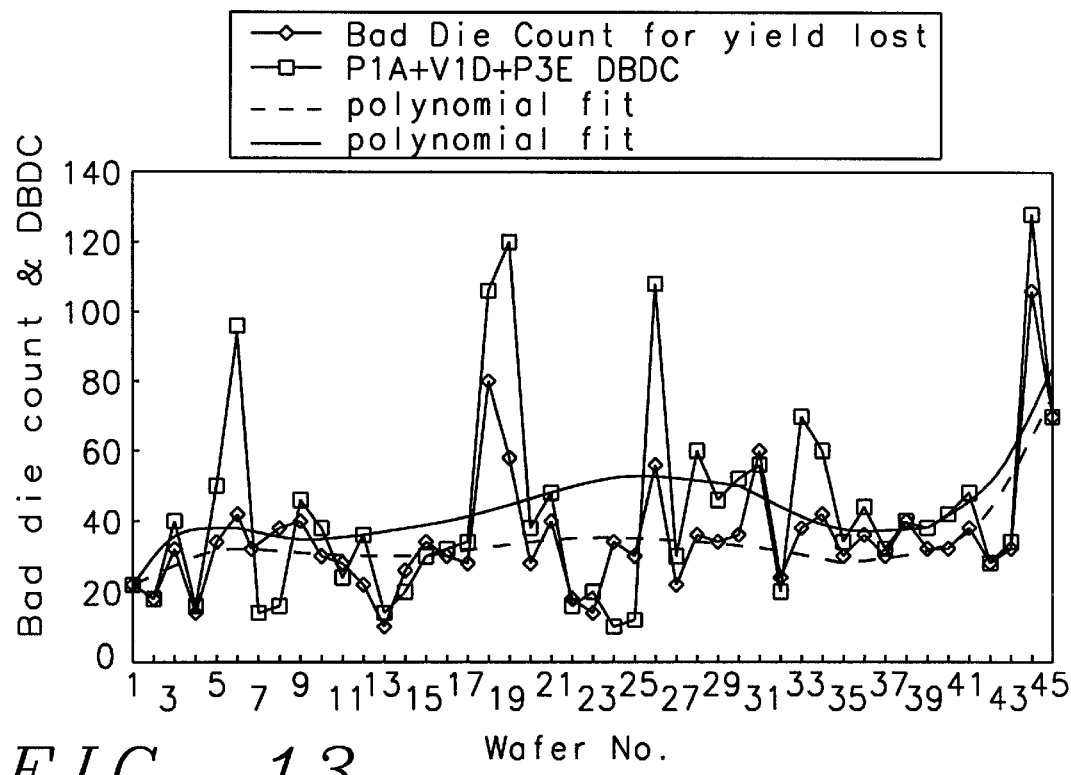
Figure 14:
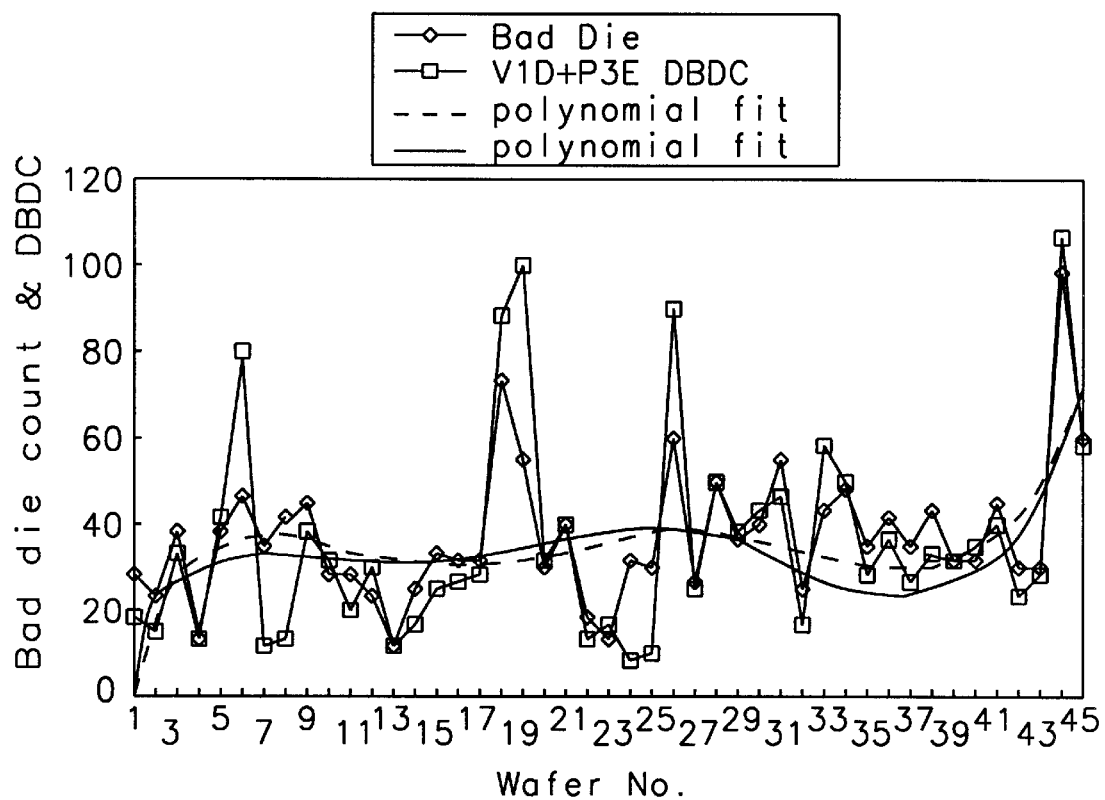
FIG. 14 shows the accumulation of the DBDC of two stages VIA-Oxide1-Dep; and Plug3-W-Etch Back.

The results of the data analysis performed by the CPU 16 are supplied on line 21 to plotter 22 which prints out charts of the results of the analysis made by the system 14 in accordance with this invention such as the DBD % and the Yield Loss % as shown in FIGS. 6–11 as well as the Bad Die Count % and DBDC % shown in FIGS. 12–14.

The graphs printed on the plotter 22 can also be displayed on the monitor 26 for use by the operator.

There is a Defect Detection System (DDS) 31 which tests the wafers W being manufactured to determine whether there are any visual defects (Area 3 and Area 4.) System 31 is connected by line 30 to the CPU 16. System 31 can be a KLA In-Line Monitor Stage (2130, 2132)

There is also a Yield Management System (YMS) 33 connected by line 32 to the CPU 16. The YMS system 33 can be commercially available product such as the Hewlett Packard HP 735 described in Ling et al U.S. Pat. No. 5,598,341 Col. 10, lines 14–52.

The method accumulates data on the visual defects that were correlated to yield loss to determine which is the major stage killing the yield of the manufacturing process.

The method uses a sixth order polynomial curve to fit with the DBDC trend chart and the major yield killing stages will be found quickly and obviously.

State of the art methods of yield loss analysis are complicated. Except the defects of some critical layers such as polysilicon, contact and metal pattern, the visual defects were not easy to verify clearly the correlation to the yield.

A simple way to identify the correlation between yield loss and visual defects is to compare the yield bit map with defective map and to calculate the Defective Bad Die percentage (DBD %) and Defective Bad Die Count (DBDC). A bad die has a specific visual defect.

The killing ratio percentage is as follows:

$$\text{Killing Ratio}\% = \frac{\text{Defective Bad Die Count}}{\text{Defective Die Count}} (\%)$$

To compare the trend chart of DBD % of specific visual defect with yield loss trend chart that will show the correlation between them. If selected the stages which visual defects had strong correlation with yield loss to calculate the DBDC and to fit the DBDC trend chart with a sixth order polynomial curve that can quickly and obviously to point out the major killer stages about yield loss. By this method of analysis the stages with major defects causing yield loss are identified providing an efficient tool for yield improvement.

FIG. 1 is a flow chart of the method of this invention

In block 40 the program begins.

In block 42 the step is to count visual defects by scanning dies at a series of several (6) stages of manufacture.

In block 44 the step is to calculate the Defective Die Count (DDC) for each wafer at each stage with the YMS.

In block 46, the step is to calculate the Defective Bad Die Count (DBDC) at each stage for each wafer with the YMS.

In block 48, the step is to determine DBD percentage by the formula:

$$DBD \text{ percentage} = \frac{DBDC}{DDC} * 100\%.$$

In block 50, the step is to plot trend chart for every stage scanned of both yield lost and DBD %.

In block 52, the step is to determine the degree of correlation of the trends of lost yield and DBD % to determine the major killer stage.

In block 54, the step is to calculate the Defective Bad Die Count (DBDC) for several (e.g. six (6)) combined stages for each wafer from the YMS data.

In block 56, the step is to plot the trend chart for several (e.g. six (6)) combined stages scanned of both yield lost and DBD %.

In block 58 the step is to determine the killer stage from the combined plot from block 56.

In block 60 the step is to modify the design to reduce source of defects in major killer stage block 62.

In block 62 the program ends.

FIGS. 6–12 show the trend charts of the yield loss and the DBD % for six stages as a function of the 45 wafers which were processed. For both the yield loss curve and the DBD % curve there are sixth order polynomial fitting curves which permit comparison of the yield loss polynomial curve with the DBD % polynomial curve. In FIGS. 6–12 the Yield loss and DBD % curves are fitted with a solid line sixth The KLA Tencor system has been used to scan the six stages as follows:

| | | |
|---|---|---|
| P1S | POLY__ASI | (Front End, Poly1-Etch) |
| P1B | PLUG1__BAR | (Plug1-BARRIER) |
| | | ILD__LAYER |
| P1D | PLUG1__DEP | (Plug1-W-BARRIER) |
| P1E | PLUG1__ETB | (Plug1-W-Etch Back) |
| V1D | V1O1__DEP | (VIA1-Oxide1-DEP) |
| | | MET1__PHOTO |
| | | MET1__SPU |
| | | MET1__ETCH |
| P3E | PLUG3__ETB | (Plug1-W-Etch Back) |
| | | VIA-2__Layer |

Figure 6:
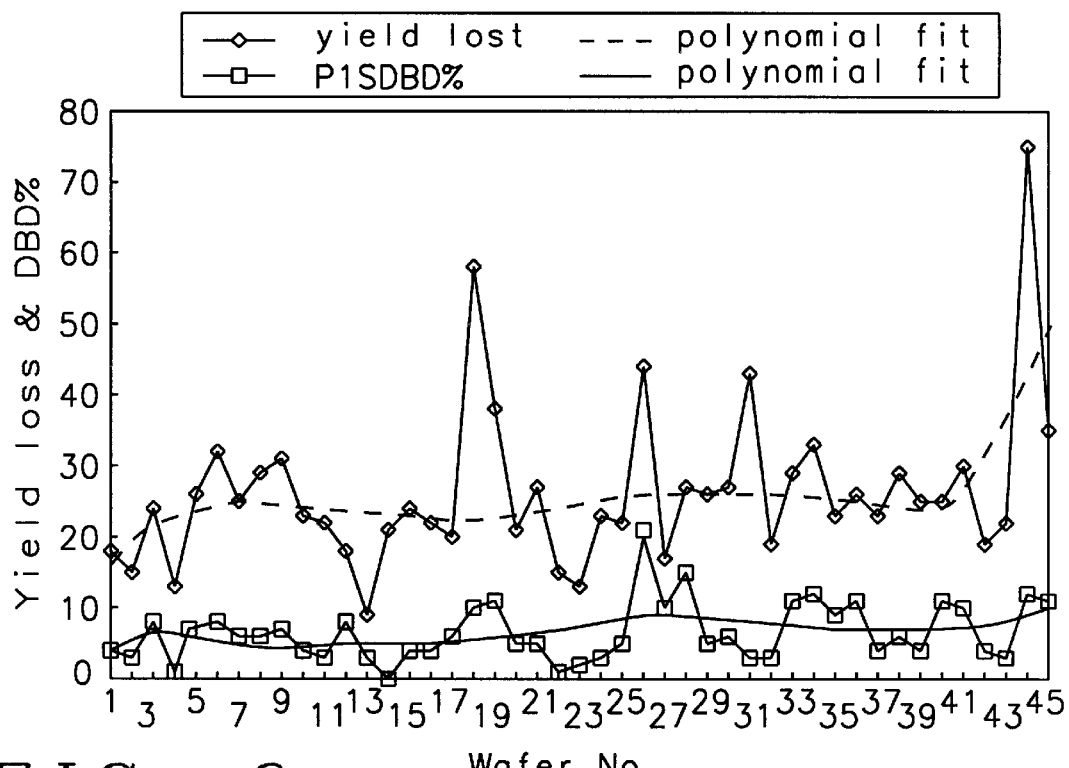
FIG. 6 shows the trend chart of yield loss & DBD % for the POLY_ASI (Front End, Poly1-Etch) inspection after strip-ping photoresist.

FIG. 6 shows the trend chart of yield loss & DBD % for the POLY__ASI (Front End, Poly1-Etch) inspection after strip-ping photoresist. The chart includes the upper curve of Percent of Yield lost and the lower curve DBD % (P1SDBD %) as a function of the wafer number of the 45 wafers being inspected. When those polynomial curves are compared to see whether the curves are similar or dissimilar, it can be seen that the two polynomial curves are not a complete match.

Figure 7:
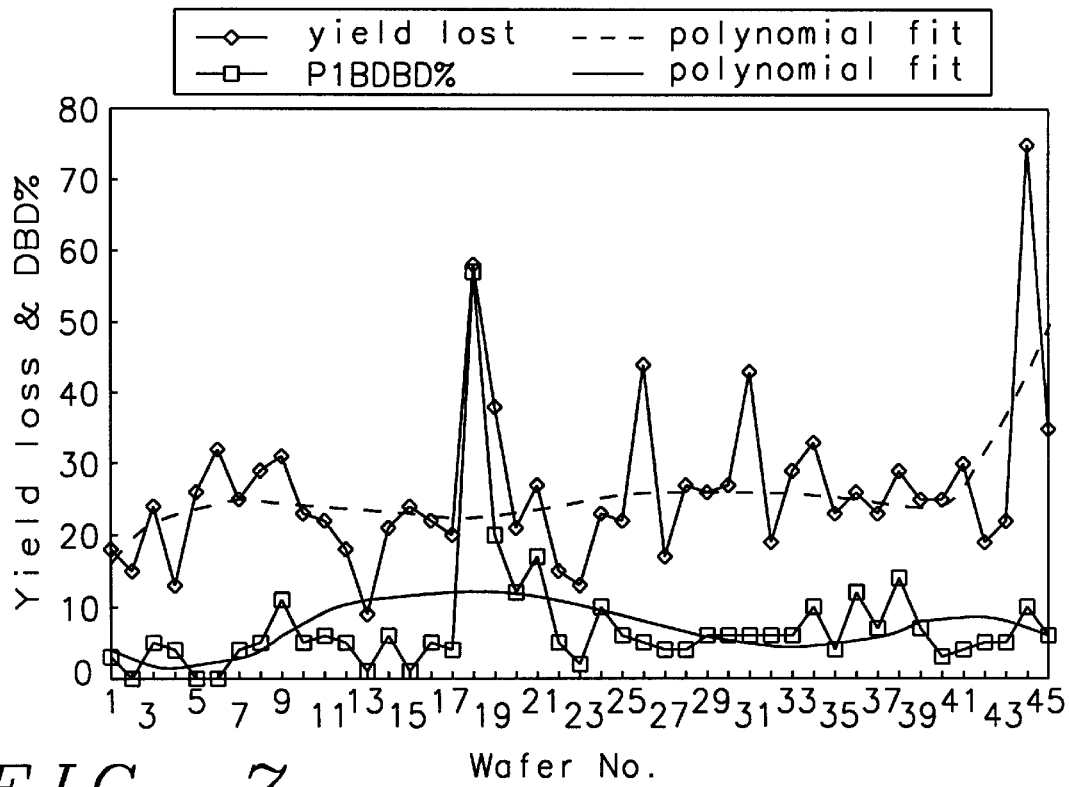
FIG. 7 shows the trend chart of yield loss & DBD % for the Plug1-BARRIER stage.

FIG. 7 shows the trend chart of yield loss & DBD % for the Plug1-BARRIER stage. The chart includes the upper curve of Percent of Yield lost and the lower curve DBD % (P1BDBD %) as a function of the wafer number of the 45 wafers being inspected. When those polynomial curves are compared to see whether the curves are similar or dissimilar, it can be seen that the two polynomial curves are not trending together, but diverge instead.

Figure 8:
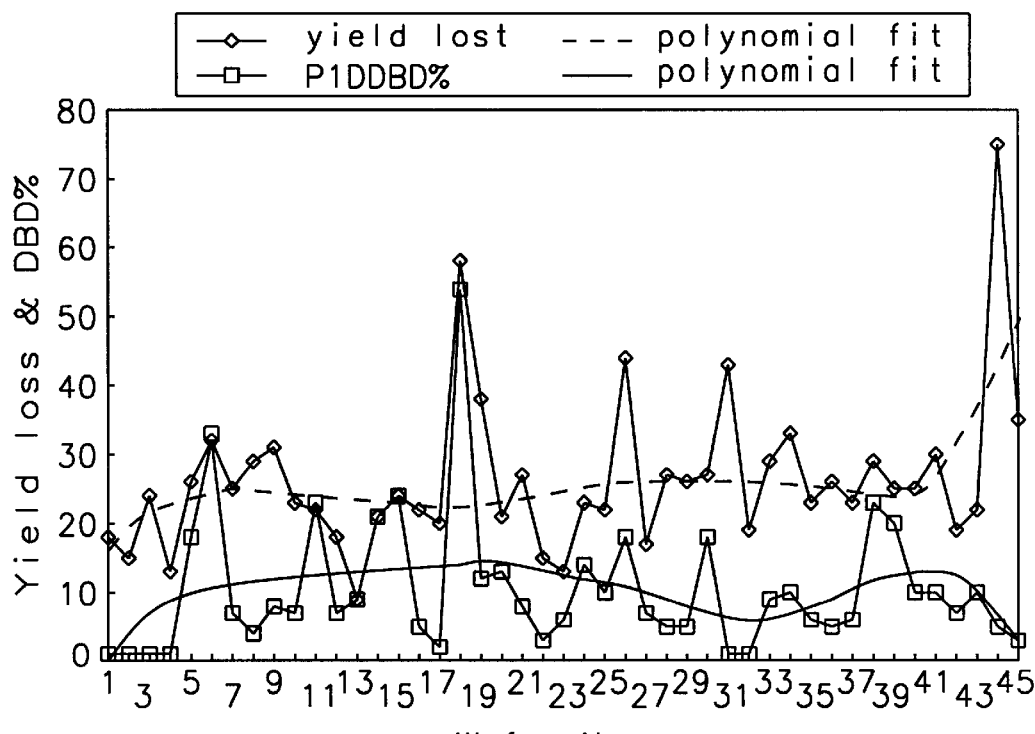
FIG. 8 shows the trend chart of yield loss & DBD % for the Plug1-W-DEP stage.

FIG. 8 shows the trend chart of yield loss & DBD % for the Plug1-W-DEP stage. The chart includes the upper curve of Percent of Yield lost and the lower curve DBD % (P1DDBD %) as a function of the wafer number of the 45 wafers being inspected. When those polynomial curves are compared to see whether the curves are similar or dissimilar, it can be seen that the two polynomial curves do not trend together, but actually diverge.

Figure 9:
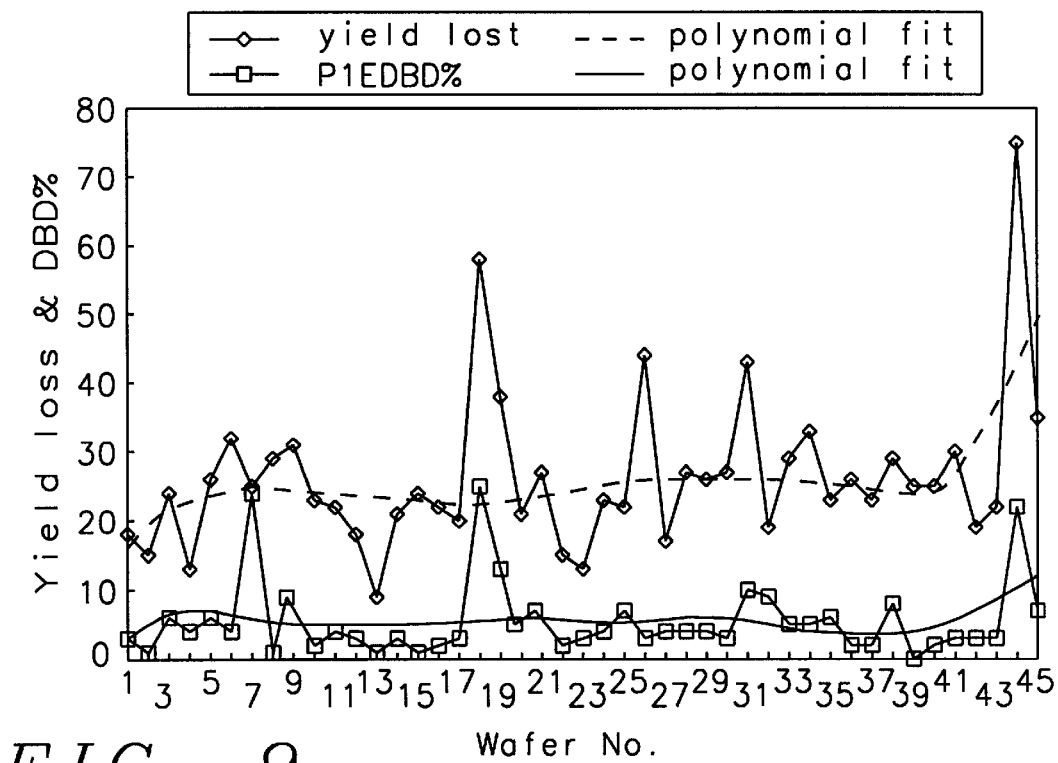
FIG. 9 shows the trend chart of yield loss & DBD % for the Plug1-W-Etch Back stage.

FIG. 9 shows the trend chart of yield loss & DBD % for the Plug1-W-Etch Back stage. The chart includes the upper curve of Percent of Yield lost and the lower curve DBD % (P1EDBD %) as a function of the wafer number of the 45 wafers being inspected. When those polynomial curves are compared to see whether the curves are similar or dissimilar, it can be seen that the two polynomial curves do not match completely.

FIG. 10 shows the trend chart of yield loss & DBD % for the VIA1-Oxide1-DEP stage. The chart includes the upper curve of Percent of Yield lost and the lower curve DBD % (V1DDBD %) as a function of the wafer number of the 45 wafers being inspected. When those polynomial curves are compared to see whether the curves are similar or dissimilar, it can be seen that the two polynomial curves which are almost a complete match.

FIG. 11 shows the trend chart of yield loss & DBD % for the Plug3-W-Etch Back stage. The chart includes the upper curve of Percent of Yield lost and the lower curve DBD % (P3EDBD %) as a function of the wafer number of the 45 wafers being inspected. When those polynomial curves are compared to see whether the curves are similar or dissimilar, it can be seen that the two polynomial curves which are almost a complete match.

The analysis resulting from the comparison of the sixth order polynomial curves of the DBD % curve as contrasted to the yield lost curves produces the conclusions tabulated in Table II.

TABLE II

| | | | |
|---|---|---|---|
| Poly1-Etch | FIG. 6 | Plug-1-Barrier | FIG. 7 |
| VIA1-Oxide1-Dep | FIG. 10 | Plug1-W-Dep | FIG. 8 |
| Plug3-W-Etch Back | FIG. 11 | Plug1-W-Etch Back | FIG. 9 |
| Obvious correlations | | No obvious correlations | |

FIGS. 12 and 13 show the correlation of 0.5 $\mu$m SPTM logic $C_p$ yield lost and KLA In-line Monitor results for the six stages of FIGS. 6–11 combined. The sampling is for 2 wafers in 1 lot. The defect size is greater than 2 $\mu$m.

In FIG. 12 the key BDC stands for Bad Die Count, and the key DBDC stands for Defective Bad Die Count. The chart includes the upper curve of six stages DBDC the and the lower curve of yield lost BDC as a function of the wafer number of the 45 wafers being inspected. There is the obvious correlation between the $C_p$ lost yield trend and the trend of accumulated defective bad die count.

FIG. 13 shows the accumulation of the DBDC of three stages Poly1-Etch; VIA1-Oxide1-Dep; and Plug3-W-Etch Back. The chart includes the curve of BDC (Yield lost) and the curve DBDC (P1A, V1D, and P3E) as a function of the wafer number of the 45 wafers being inspected. When those polynomial curves are compared to see whether the curves are similar or dissimilar, it can be seen that the two polynomial curves almost trend together.

FIG. 14 shows the accumulation of the DBDC of two stages VIA-Oxide1-Dep; and Plug3-W-Etch Back. The chart includes the curve of BDC (Yield lost) and the curve DBDC (V1D and P3E) as a function of the wafer number of the 45 wafers being inspected. When those polynomial curves are compared to see whether the curves are similar or dissimilar, it can be seen that the two polynomial curves trend together and almost match perfectly.

TABLE III

| # | Wafer ID | Good Yield Percent (%) | Lost Yield Percent (%) | DBDC | POLY1_ ASI P1SDBD % | PLUG1_BAR P1BDBD % | PLUG1_DEP P1DDBD % | PLUG1_ETB P1EDBD % | V101_DEP V1DDBD % | PLUG3_ETB P3EDBD % |
|---|---|---|---|---|---|---|---|---|---|---|
| 1 | BB6839/01 | 81.75183 | 18.24817 | 25 | 4 | 3 | 0 | 3 | 5 | 8 |
| 2 | BB6839/02 | 85.40146 | 14.59854 | 20 | 3 | 0 | 0 | 1 | 3 | 8 |
| 3 | BB6939/01 | 75.18248 | 24.81752 | 35 | 8 | 5 | 0 | 6 | 0 | 21 |
| 4 | BB6939/02 | 86.86131 | 13.13869 | 19 | 1 | 4 | 0 | 3 | 0 | 12 |
| 5 | BB6047/01 | 73.72263 | 26.27737 | 36 | 7 | 0 | 19 | 6 | 3 | 27 |
| 6 | BB6047/02 | 67.88321 | 32.11679 | 45 | 8 | 0 | 32 | 5 | 32 | 31 |
| 7 | BB6941/02 | 75.91241 | 24.08759 | 33 | 6 | 4 | 6 | 24 | 3 | 0 |
| 8 | BB6941/01 | 71.53285 | 28.46715 | 39 | 6 | 6 | 4 | 1 | 5 | 0 |
| 9 | BB7339/01 | 70.07299 | 29.92701 | 42 | 7 | 14 | 8 | 10 | 8 | 19 |
| 10 | BB7335/01 | 77.37226 | 22.62774 | 32 | 3 | 6 | 7 | 2 | 9 | 14 |
| 11 | BB7335/02 | 78.10219 | 21.89781 | 30 | 2 | 7 | 21 | 4 | 5 | 13 |
| 12 | BB7023/02 | 83.21168 | 16.78832 | 23 | 7 | 6 | 6 | 2 | 2 | 17 |
| 13 | BB7023/01 | 91.9708 | 8.0292 | 12 | 2 | 1 | 8 | 0 | 0 | 8 |
| 14 | BB7025/02 | 80.29197 | 19.70803 | 28 | 0 | 8 | 20 | 2 | 1 | 12 |
| 15 | BB7025/01 | 75.91241 | 24.08759 | 33 | 3 | 1 | 24 | 1 | 3 | 14 |
| 16 | BB7031/01 | 77.37226 | 22.62774 | 32 | 3 | 5 | 5 | 2 | 3 | 16 |
| 17 | BB7031/01 | 79.56204 | 20.43796 | 29 | 6 | 4 | 1 | 4 | 4 | 13 |
| 18 | BB6837/02 | 42.33577 | 57.66423 | 79 | 10 | 57 | 54 | 26 | 18 | 46 |
| 19 | BB6837/01 | 62.0438 | 37.9562 | 52 | 11 | 21 | 13 | 13 | 38 | 36 |
| 20 | BB8841/01 | 78.83212 | 21.16788 | 29 | 5 | 13 | 14 | 5 | 5 | 17 |
| 21 | BB8841/02 | 71.53285 | 28.46715 | 39 | 5 | 18 | 9 | 8 | 13 | 15 |
| 22 | BB9061/01 | 85.40146 | 14.59854 | 20 | 1 | 5 | 3 | 1 | 3 | 8 |
| 23 | BB9061/01 | 87.59124 | 12.40876 | 18 | 2 | 2 | 6 | 2 | 3 | 10 |
| 24 | BB9057/02 | 76.64234 | 23.3576 | 32 | 3 | 11 | 14 | 3 | 4 | 0 |
| 25 | BB9057/01 | 77.37226 | 22.62774 | 32 | 5 | 6 | 10 | 6 | 4 | 0 |
| 26 | BB8627/01 | 57.66423 | 42.33577 | 59 | 22 | 5 | 20 | 2 | 22 | 31 |
| 27 | BB9177/02 | 83.94161 | 16.05839 | 22 | 8 | 4 | 7 | 3 | 3 | 11 |
| 28 | BB9177/01 | 71.53285 | 28.46715 | 39 | 15 | 4 | 4 | 3 | 5 | 24 |
| 29 | BB9059/02 | 72.9927 | 27.0073 | 38 | 4 | 6 | 4 | 3 | 0 | 27 |
| 30 | BB9059/02 | 72.26277 | 27.73723 | 39 | 5 | 6 | 17 | 1 | 3 | 27 |
| 31 | BB8627/02 | 59.12409 | 40.87591 | 56 | 2 | 6 | 0 | 10 | 12 | 23 |
| 32 | BB9513/01 | 81.75183 | 18.24817 | 25 | 2 | 6 | 0 | 8 | 5 | 8 |
| 33 | BB9179/01 | 71.53285 | 28.46715 | 39 | 10 | 6 | 10 | 3 | 19 | 22 |
| 34 | BB9179/02 | 68.61314 | 31.38686 | 43 | 11 | 11 | 11 | 3 | 5 | 25 |
| 35 | BB9901/01 | 78.83212 | 21.16788 | 29 | 8 | 5 | 6 | 4 | 3 | 11 |
| 36 | BB9867/01 | 75.18248 | 24.81752 | 35 | 9 | 13 | 5 | 1 | 4 | 17 |
| 37 | BB9867/02 | 78.83212 | 21.16788 | 29 | 3 | 8 | 6 | 1 | 3 | 12 |
| 38 | BB9869/01 | 72.26277 | 27.73723 | 39 | 5 | 16 | 22 | 7 | 5 | 17 |
| 39 | BB9869/02 | 76.64234 | 23.35766 | 32 | 3 | 8 | 19 | 0 | 3 | 19 |
| 40 | BB9899/01 | 76.64234 | 23.35766 | 32 | 10 | 3 | 11 | 1 | 4 | 14 |
| 41 | BB9899/02 | 72.26277 | 27.73723 | 39 | 9 | 4 | 11 | 2 | 2 | 22 |
| 42 | BB9871/01 | 81.75183 | 18.24817 | 25 | 3 | 6 | 8 | 2 | 2 | 12 |
| 43 | BB9871/02 | 78.10219 | 21.89781 | 30 | 2 | 6 | 11 | 2 | 3 | 17 |
| 44 | BB9511/01 | 26.27737 | 73.72263 | 102 | 11 | 12 | 4 | 22 | 35 | 47 |
| 45 | BB9511/02 | 66.42336 | 33.37664 | 46 | 10 | 6 | 2 | 5 | 4 | 28 |
|  | AVERAGE | 74.14436 | 25.85563 | 36 | 6 | 8 | 11 | 5 | 7 | 18 |

TM4013 KLA SCAN LOT Sampling Particle Size >2 ≈ m;
Gross Die: 168;
Reported Die: 137;
BDC: Bad Die Count

TABLE IV

| # | Wafer ID | Good Yield Percent (%) | Lost Yield Percent (%) | Yld Lost BDC | P1A DB DC | P1B DB DC | P1D DB DC | P1E DB DC | V1D DB DC | P3E DB DC | S t D i a B x g D e C | ACC. Factor |
|---|---|---|---|---|---|---|---|---|---|---|---|---|
| 1 | BB6839/01 | 81.75183 | 18.24817 | 25 | 6 | 5 | 0 | 5 | 7 | 11 | 34 | 1.4 |
| 2 | BB6839/02 | 85.40146 | 14.59854 | 20 | 5 | 1 | 0 | 2 | 5 | 11 | 24 | 1.2 |
| 3 | BB6939/01 | 75.18248 | 24.81752 | 34 | 11 | 7 | 0 | 9 | 1 | 29 | 57 | 1.7 |
| 4 | BB6939/02 | 86.86131 | 13.13869 | 18 | 2 | 6 | 0 | 5 | 1 | 17 | 31 | 1.7 |
| 5 | BB6047/01 | 73.72263 | 26.27737 | 36 | 10 | 1 | 27 | 9 | 5 | 37 | 89 | 2.5 |
| 6 | BB6047/02 | 67.88321 | 32.11679 | 44 | 11 | 1 | 44 | 7 | 44 | 43 | 150 | 3.4 |
| 7 | BB6941/02 | 75.91241 | 24.08759 | 33 | 9 | 6 | 9 | 33 | 5 | 1 | 63 | 1.9 |
| 8 | BB6941/01 | 71.53285 | 28.46715 | 39 | 9 | 9 | 6 | 2 | 7 | 1 | 34 | 0.9 |
| 9 | BB7339/01 | 70.07299 | 29.92701 | 41 | 10 | 20 | 11 | 14 | 11 | 27 | 93 | 2.3 |
| 10 | BB7335/01 | 77.37226 | 22.62774 | 31 | 5 | 9 | 10 | 3 | 13 | 20 | 60 | 1.9 |

TABLE IV-continued

| # | Wafer ID | Good Yield Percent (%) | Lost Yield Percent (%) | Yld Lost BDC | P1A DB DC | P1B DB DC | P1D DB DC | P1E DB DC | V1D DB DC | P3E DB DC | S S t D i a B x g D e C | ACC. Factor |
|---|---|---|---|---|---|---|---|---|---|---|---|---|
| 11 | BB7335/02 | 78.10219 | 21.89781 | 30 | 3 | 10 | 29 | 6 | 7 | 16 | 71 | 2.4 |
| 12 | BB7023/02 | 83.21168 | 16.78832 | 23 | 10 | 9 | 9 | 3 | 3 | 24 | 58 | 2.5 |
| 13 | BB7023/01 | 91.9708 | 8.0292 | 11 | 3 | 2 | 11 | 1 | 1 | 11 | 29 | 2.6 |
| 14 | BB7025/02 | 80.29197 | 19.70803 | 27 | 1 | 11 | 28 | 3 | 2 | 17 | 62 | 2.3 |
| 15 | BB7025/01 | 75.91241 | 24.08759 | 33 | 5 | 2 | 33 | 2 | 5 | 20 | 67 | 2 |
| 16 | BB7031/02 | 77.37226 | 22.62774 | 31 | 5 | 7 | 7 | 3 | 5 | 22 | 49 | 1.6 |
| 17 | BB7031/01 | 79.56204 | 20.43796 | 28 | 9 | 6 | 2 | 6 | 6 | 18 | 47 | 1.7 |
| 18 | BB6837/02 | 42.33577 | 57.66423 | 79 | 14 | 79 | 74 | 36 | 25 | 64 | 292 | 3.7 |
| 19 | BB6837/01 | 62.0438 | 37.9562 | 52 | 16 | 29 | 18 | 18 | 53 | 50 | 184 | 3.5 |
| 20 | BB8841/01 | 78.83212 | 21.16788 | 29 | 7 | 18 | 20 | 7 | 7 | 24 | 83 | 2.9 |
| 21 | BB8841/02 | 71.53285 | 28.46715 | 39 | 7 | 25 | 13 | 11 | 18 | 21 | 95 | 2.4 |
| 22 | BB9061/02 | 85.40146 | 14.59854 | 20 | 2 | 7 | 5 | 2 | 5 | 11 | 32 | 1.6 |
| 23 | BB9061/01 | 87.59124 | 12.40876 | 17 | 3 | 3 | 9 | 3 | 5 | 14 | 37 | 2.2 |
| 24 | BB9057/02 | 76.64234 | 23.35766 | 32 | 5 | 16 | 20 | 5 | 6 | 1 | 53 | 1.7 |
| 25 | BB9057/01 | 77.37226 | 22.62774 | 31 | 7 | 9 | 14 | 9 | 6 | 1 | 46 | 1.5 |
| 26 | BB8627/01 | 57.66423 | 42.33577 | 58 | 31 | 7 | 28 | 3 | 31 | 43 | 143 | 2.5 |
| 27 | BB9177/02 | 83.94161 | 16.05839 | 22 | 11 | 6 | 10 | 5 | 5 | 16 | 53 | 2.4 |
| 28 | BB9177/01 | 71.53285 | 28.46715 | 39 | 21 | 6 | 6 | 5 | 7 | 33 | 78 | 2 |
| 29 | BB9059/02 | 72.9927 | 27.0073 | 37 | 6 | 9 | 6 | 5 | 1 | 37 | 64 | 1.7 |
| 30 | BB9059/01 | 72.26277 | 27.73723 | 38 | 7 | 9 | 24 | 2 | 5 | 37 | 84 | 2.2 |
| 31 | BB8627/02 | 59.12409 | 40.87591 | 56 | 3 | 9 | 1 | 14 | 17 | 32 | 76 | 1.4 |
| 32 | BB9513/01 | 81.75183 | 18.24817 | 25 | 3 | 9 | 1 | 11 | 7 | 11 | 42 | 1.7 |
| 33 | BB9179/01 | 71.53285 | 28.46715 | 39 | 14 | 9 | 14 | 5 | 27 | 31 | 100 | 2.6 |
| 34 | BB9179/02 | 68.61314 | 31.38686 | 43 | 16 | 16 | 16 | 5 | 7 | 35 | 95 | 2.2 |
| 35 | BB9901/02 | 78.83212 | 21.16788 | 29 | 11 | 7 | 9 | 6 | 5 | 16 | 54 | 1.9 |
| 36 | BB9867/01 | 75.18248 | 24.81752 | 34 | 13 | 18 | 7 | 2 | 6 | 24 | 70 | 2 |
| 37 | BB9867/02 | 78.83212 | 21.16788 | 29 | 5 | 11 | 9 | 2 | 5 | 17 | 49 | 1.7 |
| 38 | BB9869/01 | 72.26277 | 27.73723 | 38 | 7 | 22 | 31 | 10 | 7 | 24 | 101 | 2.7 |
| 39 | BB9869/02 | 76.64234 | 23.35766 | 32 | 5 | 11 | 27 | 1 | 5 | 27 | 76 | 2.4 |
| 40 | BB9899/01 | 76.64234 | 23.35766 | 32 | 14 | 5 | 16 | 2 | 6 | 20 | 63 | 2 |
| 41 | BB9899/02 | 72.26277 | 27.73723 | 38 | 13 | 6 | 16 | 3 | 3 | 31 | 72 | 1.9 |
| 42 | BB9871/01 | 81.75183 | 18.24817 | 25 | 5 | 9 | 11 | 3 | 3 | 17 | 48 | 1.9 |
| 43 | BB9871/02 | 78.10219 | 21.89781 | 30 | 3 | 9 | 16 | 3 | 5 | 24 | 60 | 2 |
| 44 | BB9511/01 | 26.27737 | 73.72263 | 101 | 16 | 17 | 6 | 31 | 48 | 65 | 183 | 1.8 |
| 45 | BB9511/02 | 66.42336 | 33.57664 | 46 | 14 | 9 | 3 | 7 | 6 | 39 | 78 | 1.7 |
|  | AVERAGE | 74.14436 | 25.85563 | 36 | 9 | 12 | 15 | 8 | 11 | 25 | 77 | 2.1 |

Figure 15:
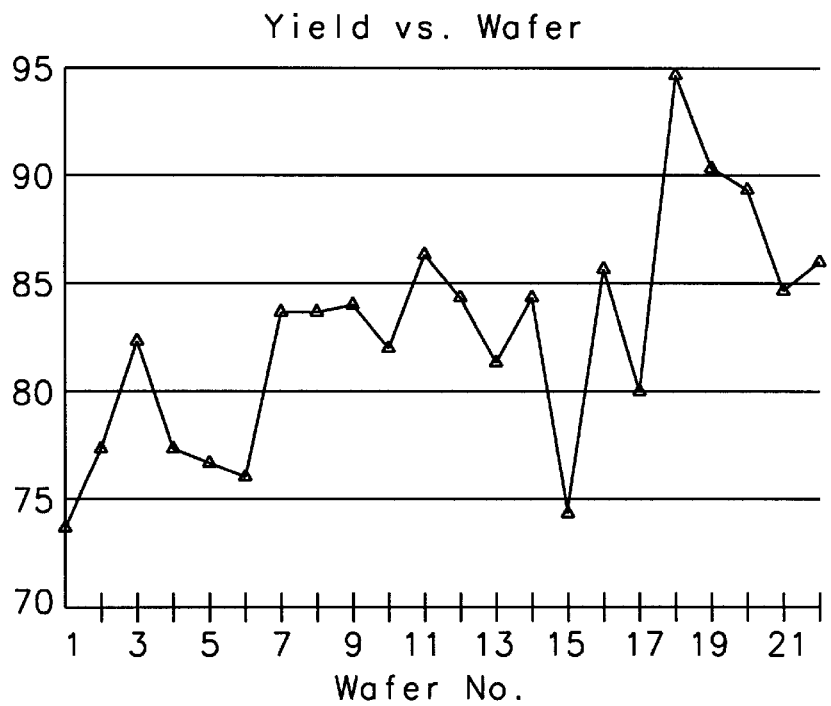
FIG. 15 shows the upward trend in yield vs. wafer in a way that the killer defect problem has been overcome.

Table V shows the results of the methods to develop an upward trend as seed in FIG. 15 in a way that the killer defect problem has been overcome using the data in Table II, the trend charts in FIGS. 6–11, and the DBDC trend charts in FIGS. 12–14 to detect the killer stages. After adjusting the process in the killer stages the results in Table V and trend chart of FIG. 15 have been achieved.

TABLE V

| # | Wafer ID | Yield | Lost | V101_DBD % | V101_DBDC | P3E_DBD % | P3E_DBDC | V101 + P3E |
|---|---|---|---|---|---|---|---|---|
| 1 | BC0475/01 | 74 | 26 | 5 | 7 | 21 | 29 | 36 |
| 2 | BC0475/02 | 78 | 22 | 7 | 10 | 18 | 25 | 35 |
| 3 | BC0791/02 | 82 | 18 | 4 | 6 | 8 | 11 | 17 |
| 4 | BC0791/01 | 78 | 22 | 8 | 11 | 13 | 18 | 29 |
| 5 | BC1001/02 | 77 | 23 | 5 | 7 | 1.5 | 21 | 28 |
| 6 | BC1001/01 | 77 | 23 | 2 | 3 | 16 | 22 | 25 |
| 7 | BC1405/02 | 84 | 16 | 5 | 7 | 10 | 14 | 21 |
| 8 | BC1401/02 | 84 | 16 | 3 | 5 | 9 | 13 | 18 |
| 9 | BC1401/01 | 85 | 15 | 8 | 11 | 7 | 10 | 21 |
| 10 | BC1399/02 | 82 | 18 | 5 | 7 | 13 | 18 | 25 |
| 11 | BC1403/02 | 87 | 13 | 3 | 5 | 8 | 11 | 161 |
| 12 | BC2195/01 | 85 | 15 | 10 | 14 | 10 | 14 | 28 |
| 13 | BC2199/02 | 82 | 18 | 2 | 3 | 11 | 16 | 19 |
| 14 | BC2199/01 | 85 | 15 | 3 | 5 | 14 | 20 | 25 |
| 15 | BC2197/02 | 74 | 26 | 6 | 9 | 10 | 14 | 23 |
| 16 | BC2197/01 | 86 | 14 | 7 | 10 | 10 | 14 | 24 |
| 17 | BC2617/01 | 80 | 20 | 5 | 7 | 3 | 5 | 12 |
| 18 | BC2617/02 | 95 | 5 | 2 | 3 | 4 | 6 | 9 |
| 19 | BC2771/02 | 90 | 10 | 3 | 5 | 7 | 10 | 15 |
| 20 | BC2771/01 | 90 | 10 | 1 | 2 | 12 | 17 | 19 |

TABLE V-continued

| | Wafer | Yield | | | | | | |
|---|---|---|---|---|---|---|---|---|
| # | ID | Yield | Lost | V101_DBD % | V101_DBDC | P3E_DBD % | P3E_DBDC | V101 + P3E |
| 21 | BC2773/02 | 85 | 15 | 7 | 10 | 7 | 10 | 20 |
| 22 | BC2773/01 | 86 | 14 | 8 | 11 | 7 | 10 | 21 |

The calculation of DBD % and DBDC while the Cp yield trend is up.

SUMMARY

According to the comparison of DBD % vs. Yield lost, the correlations between the defects of specific stages and yield loss can be found.

Calculation of trend charts of DBDC and yield loss and comparison thereof in accordance with the method of this invention points out the major killer stages.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Appendix

Method

Tool: KLA in-line defect Inspector, Yield Management System.

Method of test: To calculate and plot the trend chart of DBD % and DBDC from KLA in-line monitor results and yield bit map and to fit the trend chart of DBD % and DBDC with sixth order polynomial curves and to compare them with yield loss trend chart.

Test stages:

| KLA scan stages: Poly_asi (Front end) |
|---|
| Plug1_bar (ILD_Layer) |
| Plug1_dep |
| Plug1_etb |
| V101-dep (MET1_PHOTO |
| MET1_SPU |
| MET1_ETCH |
| Plug3_etb (VIA-2_Layer) |

Test production: 0.5 μm SPTM logic product.

Test Results

I. The Correlation Between Yield Loss and Visually Defective Stage:

| KLA In-line scan stage | Correlation between yield loss and DBD % |
|---|---|
| Poly_asi | minor |
| Plug1_bar | no |
| Plug1_dep | no |
| Plug1_etb | minor |
| V101_dep | strong |
| Plug3_etb | strong |

II. The Major Killing Stages of Yield Loss by DBDC Calculation:

V101_dep(including metal1_spu; metal1_etch; V101_dep)

Plug3_etb(including via_2 defects)

KLA Defect Scan Stages and Cover Layers

Poly1_Etch: Front End Defects.

Plug1_Barrier: ILD Layer Defects.
 PE-TEOS
 BPTEOS
 ILD-SOG

Plug1-W-Dep: W Film Defect.

Plug1-W-Etch Back: W Etch Defect.

VIA1-Oxide1-Dep: Metal1 and PE-Oxide Film Defects.

Plug3-W-Etch Back: VIA2 Layer Defects.

Having thus described the invention, what is claimed as new and desirable to be secured by Letters Patent is as follows:

1. A system for yield loss analysis for use in determining the killer stage in the manufacture of a semiconductor wafer at a plurality of manufacturing stages comprising:

means for inspecting semiconductor devices on said wafer visually to identify the location of visual defects on dies being manufactured on said wafer and to maintain a count of visual defects on said dies by location, means for inspecting said semiconductor dies on said wafer to determine the location and number defective dies on said wafer at each of said manufacturing stages, means for calculating the defective die count for each stage for said wafer, means for calculating a defective bad die count for each stage for said wafer, means for determining the percentages of defective bad dies by using the defective bad die count divided by the defective die count for each stage, means for plotting the trend in percentage of yield loss and the percentage of defective bad dies for each of said manufacturing stages, and means for comparing said plots to determine said killer stage from analysis of the relative trends of matching between said plots of yield lost and the percentage of bad dies for said stage.

2. A system in accordance with claim 1 including:

means for plotting the trend of the percentage of yield loss and the percentage of defective bad dies for each of said manufacturing stages with sixth order fitting curves.

3. A system in accordance with claim 1 including:

means for plotting the trend of the percentage of yield loss and the percentage of defective bad dies for each of said manufacturing stages with sixth order fitting curves, and comparing said plots with said sixth order fitting curves to determine said killer stage from analysis of the relative trends of matching between said plots of yield lost and the percentage of bad dies for said stage.

4. A system in accordance with claim 1 including:

means for plotting the trend of the percentage of yield loss and the percentage of defective bad dies for each of said manufacturing stages with sixth order fitting curves, and means for calculating a defective bad die count for several combined stages.

5. A system in accordance with claim 1 including:

means for plotting the trend of the percentage of yield loss and the percentage of defective bad dies for each of said manufacturing stages with sixth order fitting curves, means for calculating the defective bad die count for several combined stages, and means for plotting a trend chart for said combined stages.

6. A system in accordance with claim 1 including:

means for plotting the trend of the percentage of yield loss and the percentage of defective bad dies for each of said manufacturing stages with sixth order fitting curves, comparing said plots with said sixth order fitting curves to determine said killer stage from analysis of the relative trends of matching between said plots of yield lost and the percentage of bad dies for said stage, and means for plotting a trend chart for stages with fitting curves which indicate possibly matching trends.

* * * * *